US006914825B2

(12) United States Patent
Hsu et al.

(10) Patent No.: US 6,914,825 B2
(45) Date of Patent: Jul. 5, 2005

(54) SEMICONDUCTOR MEMORY DEVICE HAVING IMPROVED DATA RETENTION

(75) Inventors: Ching-Hsiang Hsu, Hsin-Chu (TW); Shih-Jye Shen, Hsin-Chu (TW); Ming-Chou Ho, Hsin-Chu (TW)

(73) Assignee: eMemory Technology Inc., Hsin-Chu (TW)

( * ) Notice: Subject to any disclaimer, the term of this patent is extended or adjusted under 35 U.S.C. 154(b) by 33 days.

(21) Appl. No.: 10/249,366

(22) Filed: Apr. 3, 2003

(65) Prior Publication Data

US 2004/0196698 A1 Oct. 7, 2004

(51) Int. Cl.[7] ............................................. G11C 16/04
(52) U.S. Cl. ......................... 365/185.28; 365/185.05; 365/185.26
(58) Field of Search ..................... 365/185.28, 185.05, 365/185.26

(56) References Cited

U.S. PATENT DOCUMENTS

| 4,924,278 | A | * | 5/1990 | Logie .......................... 257/318 |
| 5,329,487 | A | * | 7/1994 | Gupta et al. ................. 365/185.1 |
| 5,841,165 | A | * | 11/1998 | Chang et al. ................ 257/318 |
| 5,889,711 | A | * | 3/1999 | Yang et al. .................. 365/200 |
| 6,590,260 | B1 | * | 7/2003 | Yang et al. .................. 257/347 |
| 6,678,190 | B2 | * | 1/2004 | Yang et al. ............. 365/185.05 |
| 6,699,753 | B2 | * | 3/2004 | Ma et al. ..................... 438/257 |
| 2002/0038882 | A1 | * | 4/2002 | Hartmann et al. .......... 257/314 |
| 2003/0183872 | A1 | * | 10/2003 | Miida .......................... 257/315 |
| 2003/0234420 | A1 | * | 12/2003 | Forbes ........................ 257/315 |

* cited by examiner

*Primary Examiner*—Hoai Ho
*Assistant Examiner*—Ly Duy Pham
(74) *Attorney, Agent, or Firm*—Winston Hsu

(57) ABSTRACT

A NVM device encompasses a MOS select transistor including a select gate electrically connected to a word line, a first source doping region electrically connected to a source line, and a first drain doping region. A MOS floating gate transistor is serially electrically connected to the MOS select transistor. The MOS floating gate transistor comprises a floating gate, a second source doping region electrically connected to the first drain doping region of the MOS select transistor, and a second drain doping region electrically connected to a bit line. The second source doping region and the second drain doping region define a floating gate channel. When the MOS floating gate transistor is programmed via a hot electron injection (HEI) mode, the floating gate is a $P^+$ doped floating gate; when the MOS floating gate transistor is programmed via a hot hole injection (HHI) mode, the floating gate is an $N^+$ doped floating gate.

4 Claims, 7 Drawing Sheets

SEMICONDUCTOR MEMORY DEVICE HAVING IMPROVED DATA RETENTION

BACKGROUND OF INVENTION

1. Field of the Invention

The present invention relates generally to a semiconductor memory device and operation methods thereof. More specifically, the present invention relates to a single-poly non-volatile memory (NVM) device. The single-poly NVM device according to this invention, which is compatible with standard CMOS fabrication processes, has the advantages of low power consumption, high write/erase efficiency, improved data retention, and high packing density.

2. Description of the Prior Art

Electronic memory comes in a variety of forms to serve a variety of purposes. Flash anderasable programmable read only memory (EPROM) are used for easy and fast information storage in such devices as personal digital assistants (PDA), digital cameras and home video game consoles. Generally, an EEPROM chip has a grid of columns and rows with a cell that has two transistors at each intersection. One of the transistors is known as a floating gate, and the other one is the control gate. The floating gate's only link to the row, or word line, is through the control gate. As long as this link is in place, the cell has a value of 1. Changing the value to a 0 requires a well-known process called Fowler-Nordheimtunneling or hot carrier injection. It is often desirable to combine many functions on a single device, also called as system-on-a-chip (SOC), to reduce the number and cost of chips. Embedding NVM in a CMOS device allows a single chip produced by a manufacturer to be configured for a variety of applications, and/or allows a single device to be configured by a user for different applications. To combine with standard CMOS process flow, single-poly NVM devices have been developed.

An important property of non-volatile memories is the data retention, which is defined as the time during which the written information is still present to a sufficient degree at the floating gate. In general, the leakage current which causes the electric charge to disappear from the floating gate should be so small that the memory can remain in use without rewriting during a period of several years, for example, ten years. Continued device scaling demands that gate oxide layer becomes thinner and thinner. However, thin gate oxide layer deteriorates the loss of electric charge at the floating gate owing to tunneling of electrons from the floating gate to the substrate.

FIG. 1 is a schematic, cross-sectional view of a prior art single-poly NVM cell 10.

As shown in FIG. 1, the NVM cell 10 comprises an NMOS structure 28 and a PMOS structure 30. Field oxide layer 24 isolates the PMOS structure 30 from the NMOS structure 28. The NMOS structure 28 is formed on a P-type substrate 12 and comprises an NMOS gate 32, an N+ source region 14, and an N+ drain region 16. The PMOS structure 30 is formed on an N-well 18 and comprises a PMOS floating gate 34, a P+ source region 20, and a P+ drain region 22. A channel stop region 38 is obliquely implanted underneath the PMOS floating gate 34 for facilitating band-to-band hot electron injection into the PMOS floating gate. A conductor 36 directly electrically couples the NMOS gate 32 to the PMOS floating gate 34. That is, there is a conductive current path from one gate to the other, as opposed to indirectly coupling, such as capacitively coupling. Both gates 32 and 34 are floating, that is, they are not directly electrically coupled to a voltage or current source or sink on the IC, and at the same electrical potential. The conductor may be a polysilicon trace formed at the same time as the gates, or may be a metal or silicide conductor formed later in the fabrication sequence.

However, the above described prior art NVM cell 10 suffers from several drawbacks. First, the prior art NVM cell 10 consumes a lot of chip area since it is composed of a PMOS structure 30 and a NMOS structure 28, and the extra field oxide layer 24 is needed for isolating the PMOS 30 form the NMOS 28. Second, the prior art NVM cell 10 needs an extra channel stop region 38 and formation of conductor 36 for connecting two gates, this, in turns, means extra process steps and thus raised cost.

SUMMARY OF INVENTION

Accordingly, it is a primary objective of this invention to provide a single-poly electrically programmable logic device (EPLD) to solve the above-mentioned problems.

It is a further objective of this invention to provide a single-poly non-volatile memory (NVM) device, which is fabricated with CMOS-compatible processes and has improved data retention.

Briefly summarized, one preferred embodiment of the present invention discloses a non-volatile memory (NVM) device. The NVM device comprises a MOS select transistor comprising a select gate electrically connected to a word line, a first source doping region electrically connected to a source line, and a first drain doping region. A MOS floating gate transistor is serially connected to the MOS select transistor. The MOS floating gate transistor comprises a floating gate, a second source doping region electrically connected to the first drain doping region of the MOS select transistor, and a second drain doping region electrically connected to a bit line. The second source doping region and the second drain doping region define a floating gate channel. When the MOS floating gate transistor is programmed via a hot electron injection (HEI) mode, the floating gate is a P+ doped floating gate; when the MOS floating gate transistor is programmed via a hot hole injection (HHI) mode, the floating gate is an N+ doped floating gate.

In accordance with another preferred embodiment of the present invention, an electrically programmable logic device is disclosed. The electrically programmable logic device comprises a P substrate; an N well formed in the P substrate; a PMOS select transistor formed on the N well, wherein the PMOS select transistor comprises a select gate biased to a word line voltage, a first P+ source region biased to a source line voltage, and a first P+ drain region; and a PMOS floating gate transistor formed on the N well and being serially connected to the PMOS select transistor, wherein the PMOS floating gate transistor comprises a P type doped floating gate, a second P+ source region electrically connected to the first P+ drain region of the PMOS select transistor, and a second P+ drain region biased to a bit line voltage, and wherein the second P+ source region and the second P+ drain region define a floating gate P-channel.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
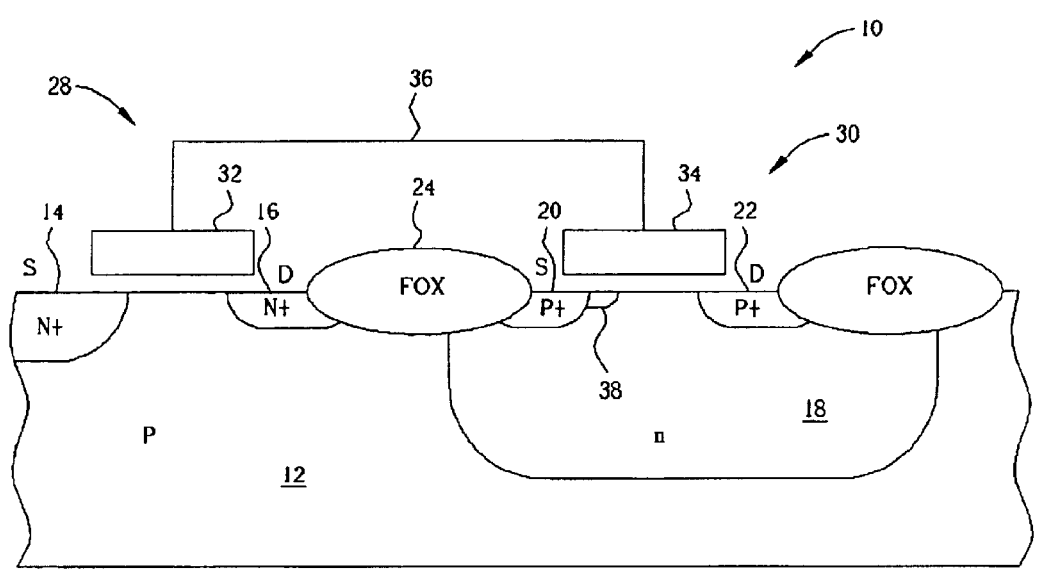
FIG. 1 is a simplified cross section of an NVM cell according to the prior art.
Figure 2:
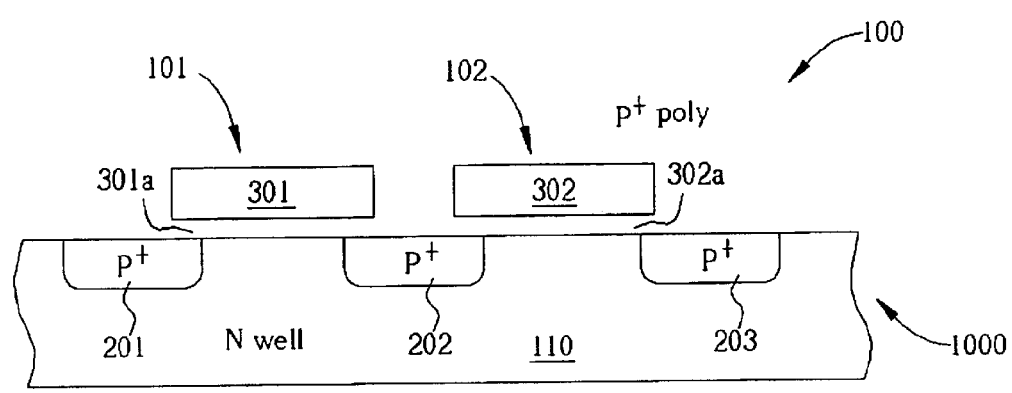
FIG. 2(a) is a schematic, cross-sectional diagram depicting an electrically programmable logic device 100 according to the present invention.
FIG. 2(b) is a planar view of the electrically programmable logic device 100 as set forth in FIG. 2(a).
Figure 2:
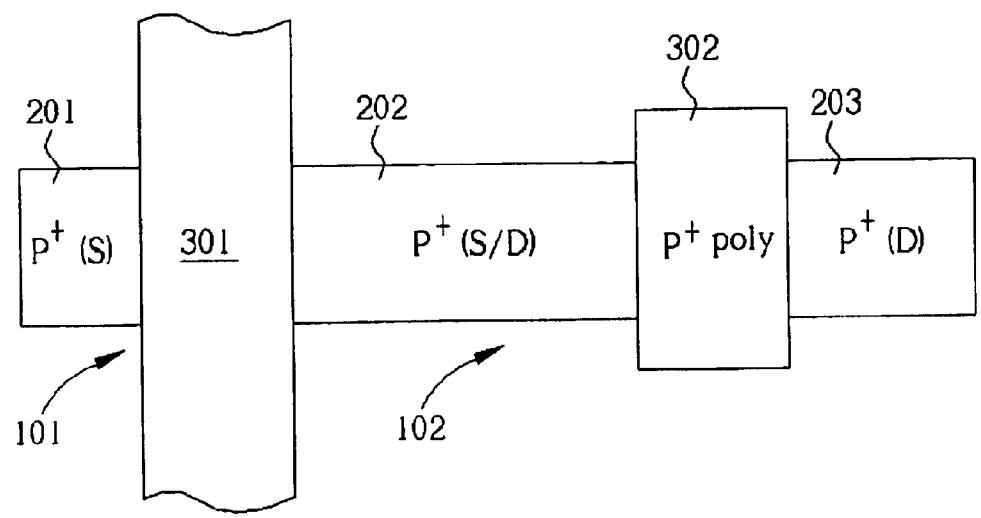

Please refer to FIG. 2(a) and FIG. 2(b). FIG. 2(a) is a schematic, cross-sectional diagram depicting an electrically programmable logic device 100 according to the present invention. FIG. 2(b) is a planar view of the electrically programmable logic device 100 as set forth in FIG. 2(a). As shown in FIG. 2(a) and FIG. 2(b), the electrically programmable logic device 100 comprises a PMOS transistor 101 and a PMOS transistor 102 serially connected to the PMOS transistor 101 through a commonly used P$^+$ doping region 202. The PMOS transistor 101 and PMOS transistor 102 are both formed on N well 110 of P type semiconductor substrate 1000. The PMOS transistor 101 comprises a select gate 301, a P$^+$ source region 201, and the P$^+$ doping region 202 acting as a drain of the PMOS transistor 101. The PMOS transistor 102 is a floating gate transistor comprising a P$^+$ poly floating gate 302, a P$^+$ drain region 203, and the P$^+$ doping region 202 acting as a source of the PMOS transistor 102. It is noted that the floating gate 302 consists of a single layer polysilicon according to the present invention, that is, there is no word line or control electrode stacked thereon.

As shown in FIG. 2(a), the PMOS transistor 101 further comprises a gate oxide layer 301a disposed underneath the select gate 301. The PMOS transistor 102 further comprises a floating gate oxide layer 302a disposed underneath the floating gate 302. A bit line (not shown) is electrically connected with the P$^+$ drain region 203 of the PMOS transistor 102 to provide the electrically programmable logic device 100 with a bit line signal. In accordance with the preferred embodiment of the present invention, the floating oxide layer 302a and gate oxide layer 301a may have same thickness as that of the gate oxide layer fabricated in a logic circuit area, while extra thermal processes may be carried out to increase the thickness of the floating gate oxide layer 302a or the thickness of the gate oxide layer 301a. The electrically programmable logic device 100 of this invention is compatible with standard CMOS semiconductor processes.

Figure 3:
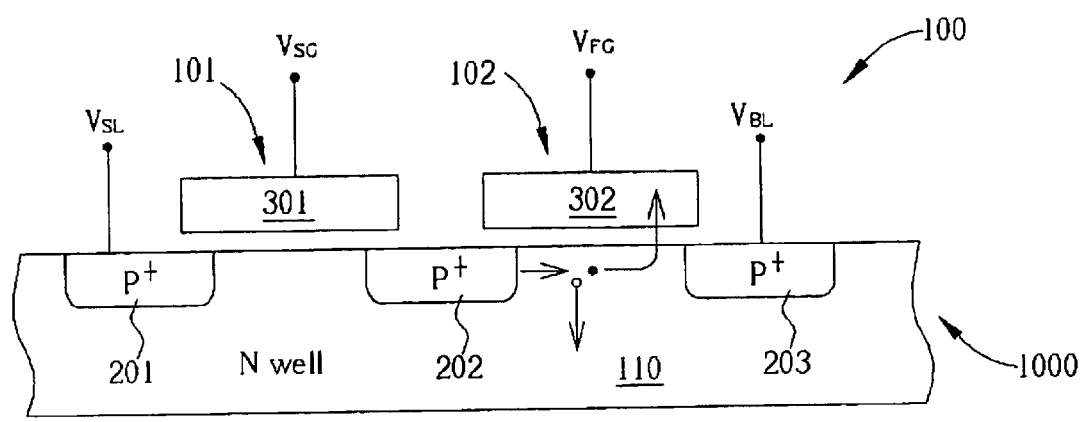
FIG. 3 is a schematic, cross-sectional diagram illustrating the operation of programming the electrically programmable logic device 100 according to the present invention.

Please refer to FIG. 3. FIG. 3 is a schematic, cross-sectional diagram illustrating the operation of programming the electrically programmable logic device 100 according to the present invention. As shown in FIG. 3, when performing the program operation, a word line voltage $V_{SG}$ is applied on the select gate 301 of the PMOS transistor 101, thereby turning on a P-channel thereof. A source line voltage V is applied on the P$^+$ source region 201. A well voltage $V_{NW}$ is applied on the N well 110. A bit line voltage VBL is applied on the P+ drain region 203 of the PMOS transistor 102. The floating gate 302 of the PMOS transistor 102 is in a floating state. Under the above voltage condition, a coupling voltage is sensed by the floating gate 302 due to capacitive coupling effect, thereby turning on a P-channel under the floating gate Hot carriers such as electrons, which are accelerated by electric field at the depletion region, tunnel through the floating gate oxide layer 302a by way of the turned on P-channel, and finally trapped inside the P$^+$ floating gate 302.

Figure 4:
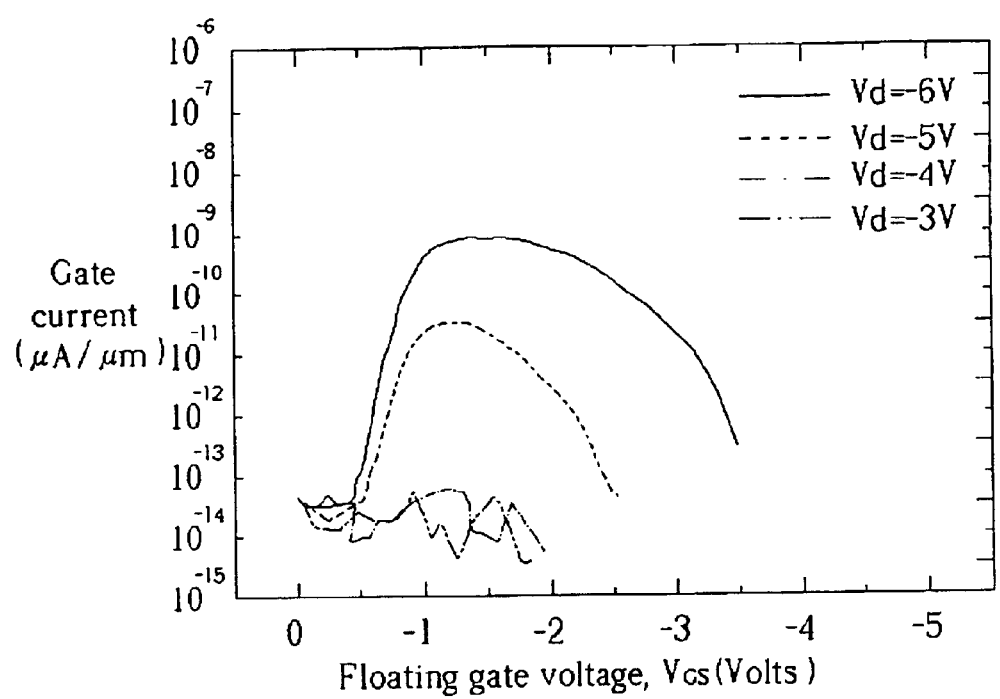
FIG. 4 plots the gate currents versus gate voltages of the floating gate 302 at different drain to N-well bias ($V_d=V_{BL}-V_{NW}$) with respect to the PMOS transistor 102.

Please refer to FIG. 4. FIG. 4 plots the gate currents versus gate voltages of the floating gate 302 at different drain to N-well bias ($V_d=V_{BL}-V_{NW}$) with respect to the PMOS transistor 102. As shown in FIG. 4, at a drain voltage bias $V_d=-5V$, for example, the floating gate 302 acquires a relatively low-level coupling voltage $V_{FG}$ of about $-1\sim-2V$ ($V_{FG}$ is contributed by bit line voltage $V_{BL}$, N well voltage $V_{NW}$, and the voltage on the P$^+$ source region 202 of the PMOS transistor 102). At the same time, the P-channel of PMOS transistor 102 is just turned on and reaches a gate current approaching a maximum value of about $5\times10^{-11}$ $\mu A/\mu m$. In other words, it is clear that a better performance during the writing (program) operation can be achieved according to the present invention, since the gate current to drain current ratio ($I_g/I_d$) is improved.

Figure 6:
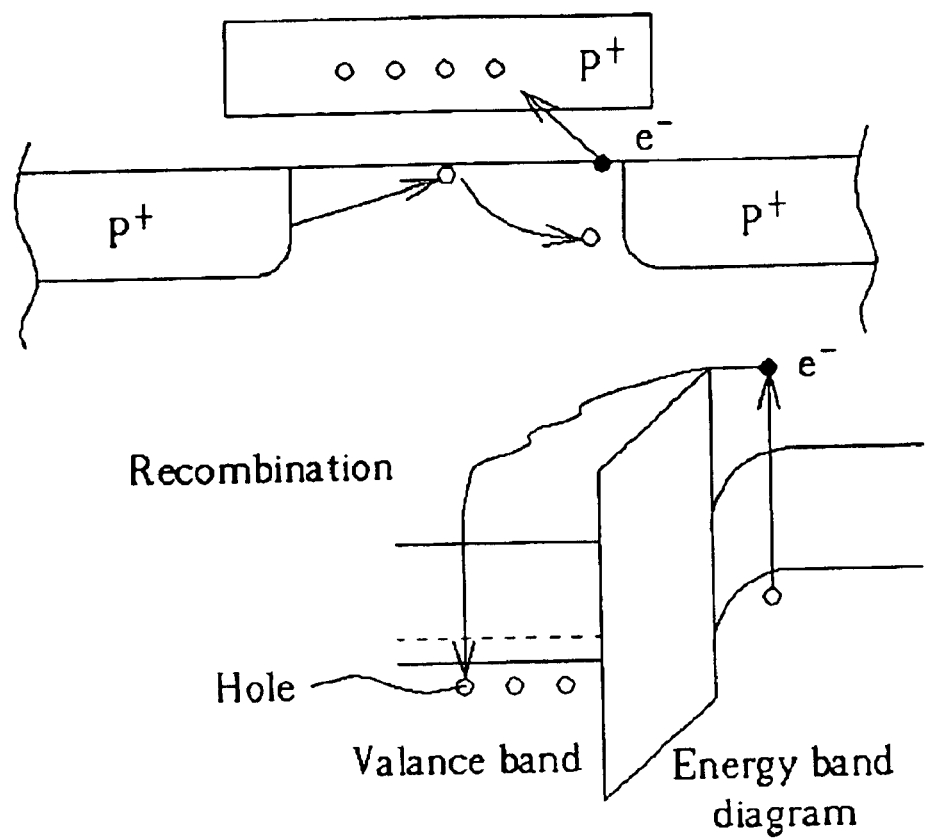
FIG. 6 is a schematic energy band diagram illustrating electron injection of P$^+$ poly gate according to the present invention.

Please refer to FIG. 6. FIG. 6 is a schematic energy band diagram illustrating electron injection of P$^+$ poly gate according to the present invention. It is one the main features of the present invention that the floating gate 302 of the PMOS transistor 102 is P$^+$ doped. Preferably, the floating gate 302 of the PMOS transistor 102 has a doping concentration of about $1.0\times10^{19}$ cm$^{-3}$ to $1.5\times10^{19}$ cm$^{-3}$ (boron). The P$^+$ doped floating gate 302 has excess free holes in the floating gate. Hot electrons injected into the floating gate 302 will recombine with these free holes, thus generates negative ion charge in the floating gate 302. These localized negative ion charges are not movable and are largely present at a greater distance from the poly-gate oxide interface than the free electrons at an N-type floating gate. Consequently, the loss of electric charge at the floating gate is reduced and data retention is improved.

Figure 5:
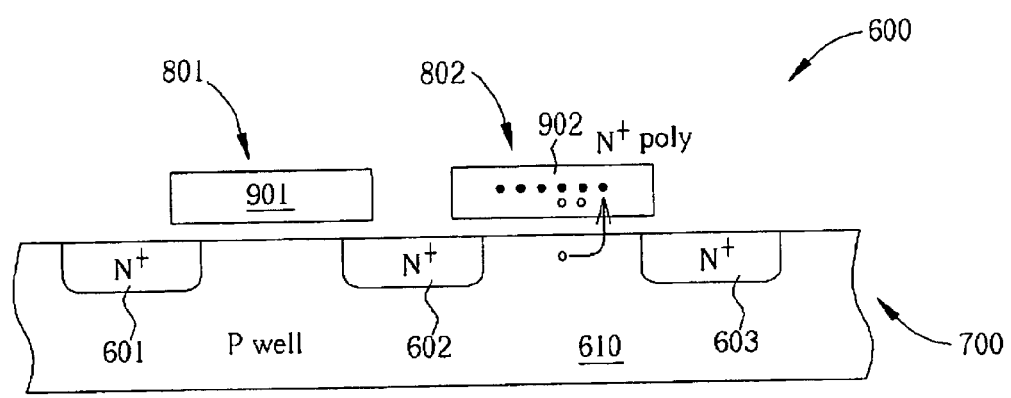
FIG. 5 is a schematic, cross-sectional diagram showing an electrically programmable logic device 600 according to another preferred embodiment of the present invention.

Please refer to FIG. 5. FIG. 5 is a schematic, cross-sectional diagram showing an electrically programmable logic device 600 according to another preferred embodiment of the present invention. As shown in FIG. 5, the electrically programmable logic device 600 comprises an NMOS transistor 801 and an NMOS transistor 802 serially connected to the NMOS transistor 801 through a commonly used N$^+$ doping region 602. The NMOS transistor 801 and NMOS transistor 802 are both formed on P well 610 of N type semiconductor substrate 700. The NMOS transistor 801 comprises a select gate 901, an N$^+$ source region 601, and the N$^+$ doping region 602 acting as a drain of the NMOS transistor 801. The NMOS transistor 802 is a floating gate transistor comprising a single-poly floating gate 902, an N$^+$ drain region 603, and the N$^+$ doping region 602 acting as a source of the NMOS transistor 802. The floating gate 902 consists of a single layer polysilicon according to the present invention, that is, there is no word line or control electrode stacked thereon. The floating gate 902 of the NMOS transistor 802 is N$^+$ doped. This means that the N$^+$ doped floating gate 902 has excess free electrons in the floating gate. Hot holes injected into the floating gate 902 will recombine with these free electrons, thus generates positive ion charge in the floating gate 902. These localized positive ion charges are not movable and are largely present at a greater distance from the poly-gate oxide interface than the free holes at an N-type floating gate. Consequently, the loss of electric charge at the floating gate is reduced.

In contrast to the prior art, the present invention provides an EPLD, which can be operated at low voltages and can thus achieve the goal of saving energy. The unique design allows a greater gate current to drain current ratio ($I_g/I_d$), which means improved performance, higher data writing efficiency, and lower power dissipation. A gate current ($I_g$) approaching a maximum current is achieved right on the opening or turn on of the PMOS transistor. Further, the serially connected PMOS transistors save a great deal of valuable chip area. Moreover, the single-poly EPLD or NVM structure according to the present invention is capable of combing with standard CMOS fabrication processes. When the floating gate transistor is programmed via a HEI (hot electron injection) mode, the polysilicon floating gate is a $P^+$ doped floating gate. When the MOS floating gate transistor is programmed via a HHI (hot hole injection) mode, the polysilicon floating gate is an $N^+$ doped floating gate. By doing this, the loss of electric charge at the floating gate is reduced and data retention is improved.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. An electrically programmable logic device, comprising:

a P substrate;

an N well formed in the P substrate;

a PMOS select transistor formed on the N well, wherein the PMOS select transistor comprises a select gate biased to a word line voltage, a first $P^+$ source region biased to a source line voltage, and a first $P^+$ drain region; and a PMOS floating gate transistor formed on the N well and being serially electrically connected to the PMOS select transistor, wherein the PMOS floating gate transistor comprises a P type doped floating gate that does not capacitively couple to any control gate over or under the P type doped floating gate, a second $P^+$ source region electrically connected to the first $P^+$ drain region of the PMOS select transistor, and a second $P^+$ drain region biased to a bit line voltage, and wherein the second $P^+$ source region and the second $P^+$ drain region define a floating gate P-channel.

2. The electrically programmable logic device according to claim 1 wherein the PMOS select transistor further comprises a gate oxide layer disposed underneath the select gate.

3. The electrically programmable logic device according to claim 1 wherein the PMOS floating gate transistor further comprises a floating gate oxide layer disposed underneath the P type doped floating gate.

4. The electrically programmable logic device according to claim 1 wherein when programming the electrically programmable logic device, hot electrons are injected into the P type doped floating gate and recombine with free holes at the floating gate, thus generates localized negative ion charge in the floating gate, thereby reducing loss of electric charge at the floating gate and improving data retention.

* * * * *